US008442954B2

(12) United States Patent
Spackman

(10) Patent No.: US 8,442,954 B2
(45) Date of Patent: May 14, 2013

(54) CREATING AND MANAGING LINKS TO DEDUPLICATION INFORMATION

(76) Inventor: Stephen Philip Spackman, San Jose, CA (US)

( * ) Notice: Subject to any disclaimer, the term of this patent is extended or adjusted under 35 U.S.C. 154(b) by 966 days.

(21) Appl. No.: 12/506,400

(22) Filed: Jul. 21, 2009

(65) Prior Publication Data

US 2011/0022825 A1    Jan. 27, 2011

(51) Int. Cl.
*G06F 7/00* (2006.01)
*G06F 17/00* (2006.01)

(52) U.S. Cl.
USPC ........................................................ 707/692

(58) Field of Classification Search ............ 707/692–93, 707/692–693
See application file for complete search history.

(56) References Cited

U.S. PATENT DOCUMENTS

| | | | |
|---|---|---|---|
| 5,708,846 A * | 1/1998 | Ryan | 710/7 |
| 6,904,430 B1 * | 6/2005 | Livshits | 1/1 |
| 7,487,169 B2 * | 2/2009 | Agarwal | 1/1 |
| 7,653,643 B2 * | 1/2010 | Livshits | 707/999.101 |
| 8,108,353 B2 * | 1/2012 | Balachandran et al. | 707/664 |
| 2009/0300321 A1 * | 12/2009 | Balachandran et al. | 711/216 |
| 2009/0313248 A1 * | 12/2009 | Balachandran et al. | 707/6 |
| 2011/0184966 A1 * | 7/2011 | Reiter et al. | 707/758 |

\* cited by examiner

*Primary Examiner* — Jeffrey A Burke

(57) ABSTRACT

In a method of linking to information in a deduplication data sequence, a branching point is identified. The branching point is a place where a branch data sequence diverges from a parent data sequence that has been previously stored in a data deduplication process. A signature value associated with a subsequence of the information represented in the branch data sequence is determined. A branch location where the information of the branch data sequence begins is identified. Link information is stored in association with the branching point. The link information is stored in a computer memory. The link information comprises a link to the branch location and also comprises a portion of the signature value.

25 Claims, 8 Drawing Sheets

300

```
┌─────────────────────────────────────────────────┐
│ IDENTIFY A BRANCHING POINT WHERE A BRANCH DATA  │
│ SEQUENCE DIVERGES FROM A PARENT DATA SEQUENCE   │
│ THAT HAS BEEN PREVIOUSLY STORED IN A DATA       │
│ DEDUPLICATION PROCESS.                          │
│                      310                        │
└─────────────────────────────────────────────────┘
                          │
                          ▼
┌─────────────────────────────────────────────────┐
│ DETERMINE A SIGNATURE VALUE ASSOCIATED WITH A   │
│ SUBSEQUENCE OF THE INFORMATION REPRESENTED IN   │
│ THE BRANCH DATA SEQUENCE.                       │
│                      320                        │
└─────────────────────────────────────────────────┘
                          │
                          ▼
┌─────────────────────────────────────────────────┐
│ IDENTIFY A BRANCH LOCATION WHERE THE            │
│ INFORMATION OF THE BRANCH DATA SEQUENCE BEGINS. │
│                      330                        │
└─────────────────────────────────────────────────┘
                          │
                          ▼
┌─────────────────────────────────────────────────┐
│ IN ASSOCIATION WITH THE BRANCHING POINT, STORE  │
│ LINK INFORMATION IN A COMPUTER MEMORY, WHEREIN  │
│ THE LINK INFORMATION COMPRISES A LINK TO THE    │
│ BRANCH LOCATION AND A PORTION OF THE SIGNATURE  │
│ VALUE.                                          │
│                      340                        │
└─────────────────────────────────────────────────┘
                          │
                          ▼
                         (A)
```

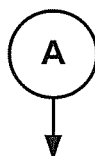

DURING A FOLLOW-ON DEDUPLICATION ACTIVITY INVOLVING REFERENCE TO THE BRANCHING POINT OF THE PARENT DATA SEQUENCE, COMPARE A SECOND SIGNATURE VALUE ASSOCIATED WITH A NEXT BLOCKLET TO BE DEDUPLICATED IN THE FOLLOW-ON DEDUPLICATION ACTIVITY TO DETERMINE IF THE PORTION OF THE SIGNATURE VALUE MATCHES WITH A LIKE RANGE OF THE SECOND SIGNATURE VALUE.
353

IN THE EVENT OF THE PORTION MATCHING, USE THE LINK INFORMATION TO BRANCH TO THE BRANCH LOCATION TO CONTINUE WITH THE FOLLOW-ON DEDUPLICATION ACTIVITY.
355

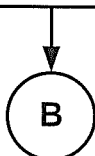

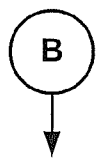

IDENTIFY A RETURNING POINT WHERE THE BRANCH DATA SEQUENCE RETURNS TO THE PARENT DATA SEQUENCE.
362

IDENTIFY A RETURN LOCATION IN THE PARENT DATA SEQUENCE WHERE THE BRANCH DATA SEQUENCE RETURNS FROM THE RETURNING POINT TO RESUME THE PARENT DATA SEQUENCE.
364

DETERMINE A RETURN LOCATION SIGNATURE VALUE OF A BLOCKLET OF INFORMATION REPRESENTED AT THE RETURN LOCATION.
366

IN ASSOCIATION WITH THE RETURNING POINT, STORE ADDITIONAL LINK INFORMATION IN A COMPUTER MEMORY, WHEREIN THE ADDITIONAL LINK INFORMATION COMPRISES A LINK TO THE RETURN LOCATION AND ALSO COMPRISES A PORTION OF THE RETURN LOCATION SIGNATURE VALUE.
368

IN ASSOCIATION WITH A DIVERGING POINT FROM A DATA SEQUENCE, STORE LINK INFORMATION IN A COMPUTER MEMORY, WHEREIN THE LINK INFORMATION COMPRISES A LINK TO A DIVERGENT LOCATION WHERE INFORMATION OF A DIVERGENT DATA SEQUENCE BEGINS DIVERGING FROM THE DIVERGENT POINT.
410

STORE AN UPDATABLE LINK VALUE IN ASSOCIATION WITH THE LINK INFORMATION, WHEREIN THE LINK VALUE IS SET TO AN INITIAL LEVEL UPON INITIAL STORAGE OF THE LINK INFORMATION AND UPDATED OVER TIME BASED UPON USEFULNESS OF THE LINK INFORMATION.
420

USE THE LINK VALUE TO INFORM COMPETITIVELY MANAGED RETENTION OF A PLURALITY OF LINK INFORMATION STORED IN THE COMPUTER MEMORY.
430

FIG. 4

CREATING AND MANAGING LINKS TO DEDUPLICATION INFORMATION

BACKGROUND

Data deduplication is a technique used to reduce the overall amount of data storage required to represent and retain data. In general, data deduplication works by identifying duplicate portions of the data being stored and replacing those duplicate portions with pointers to existing stored copies of that data. In this manner, a unique sequence of data identified by a deduplication engine is only required to be stored a single time.

A primary index in a deduplication engine is a data structure used for storing signature values, such as hash values, that are associated with sequences of data that are being stored. These sequences of data are often small portions of a larger file or a data stream and are referred to as a blocklets. Copies of unique blocklets are typically stored in a blockpool which may reside in mass storage such as on hard disk drive or storage area network. A pointer to an address/location in a blockpool can be stored in the primary index to point from the signature of a blocklet to the actual storage location of the data that comprises it.

One of the bottlenecks in bulk data matching tasks, such as data deduplication, is access to the primary index. This bottleneck exists because in many storage technologies, such as disk drives and even solid state storage, random data access is much slower than sequential data access. Because of this slowness, content-driven lookup, such as looking up or searching for a signature of a blocklet in a primary index, can take considerable time, as it is an inherently random process. The slowness of random access is compounded by the fact that primary indexes can often be very large. Thus, in some implementations of deduplication engines it is desirable to move some data that would conventionally be found only in the primary index to alternate storage locations outside of the primary index, that are physically adjacent to data blocks that are statistically likely to have been required in the recent past. Such storage outside a primary index can be referred to by many names. For example, in some implementations, cluster headers are used for such storage outside of the primary index. Cluster headers are often stored in mass storage, such as on disk, but are typically small enough to be loaded into a random access memory where they can be very quickly accessed.

During deduplication, a signature value, such as a hash value for a blocklet of data being deduplicated, may initially be looked up in the primary index of a deduplication engine. In some embodiments, the primary index then references an outside storage location, such as a cluster header (it is also possible in some embodiments that the lookup may begin in a location outside the primary index). In some embodiments, this outside storage location includes portions of the information content of the primary index. For example, this storage outside the primary index can include blocklet signature values and associated pointers to the actual data of blocklets (e.g. a pointer from a signature value to an address in a blockpool where the actual data of a blocklet is stored).

Alternatives are possible, but an outside storage location typically comprises, or is closely related to, a sequential representation of blocklets of a previously deduplicated data stream. After finding an initial blocklet's signature in this sequential representation, a time savings and computational savings is realized if the signature for the next blocklet from the data stream that is currently being deduplicated happens to be a sequential repetition of the previously seen data stream that is represented in the outside storage. An instance where this sequential matching occurs offers time and computational savings by precluding the deduplication engine from expending the time and computational resources required to search for the signature by random access through the primary index. As a fair amount of stored data tends to be data that is repetitive in nature, such use of storage outside the primary index can generate an overall gain in deduplication efficiency.

BRIEF DESCRIPTION OF THE DRAWINGS

The accompanying drawings, which are incorporated in and form a part of this specification, illustrate some embodiments of the subject matter and, together with the description, serve to explain principles discussed below:

FIGS. 3A-3C illustrate a flow diagram of an example method of linking to information in a deduplication data sequence, according to an embodiment FIG. 4 illustrates a flow diagram of an example method of informed deduplication link information management, according to an embodiment.

Figure 1:
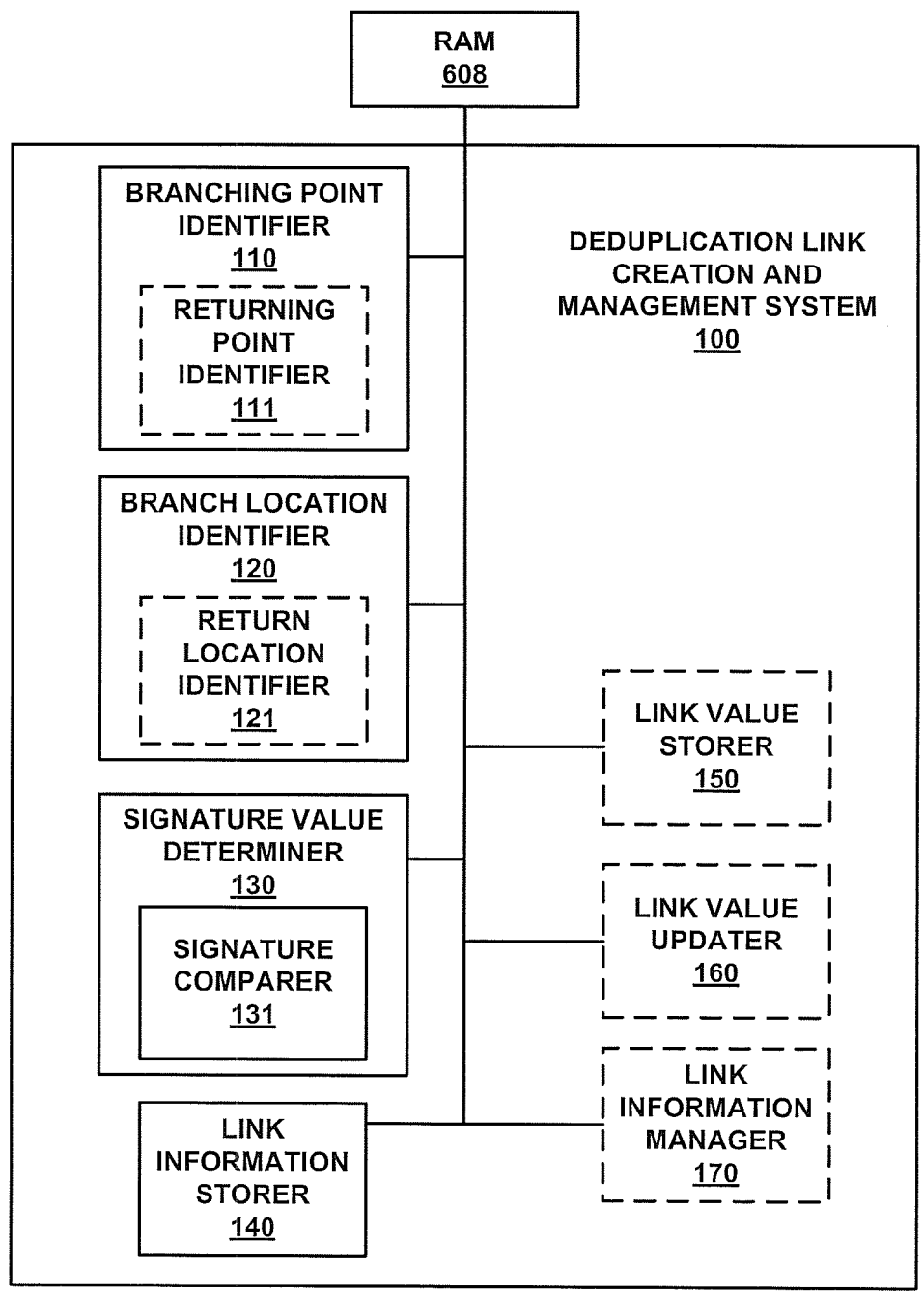
FIG. 1 is a block diagram of an example deduplication link creation and management system, according to an embodiment.

The drawings referred to in this brief description should be understood as not being drawn to scale unless specifically noted.

DESCRIPTION OF EMBODIMENTS

Reference will now be made in detail to various embodiments of the subject matter, examples of which are illustrated in the accompanying drawings. While the subject matter discussed herein will be described in conjunction with various embodiments, it will be understood that they are not intended to limit the described subject matter to these embodiments. On the contrary, the presented embodiments of the invention are intended to cover alternatives, modifications and equivalents that may be included within the spirit and scope of the various embodiments as defined by the appended claims. Furthermore, in the following description of embodiments, numerous specific details are set forth in order to provide a thorough understanding of embodiments of the subject matter. However, embodiments may be practiced without these specific details. In other instances, well known methods, procedures, components, and circuits have not been described in detail as not to unnecessarily obscure aspects of the described embodiments.

NOTATION AND NOMENCLATURE

Unless specifically stated otherwise as apparent from the following discussions, it is appreciated that throughout the description of embodiments, discussions utilizing terms such as "identifying," "determining," "storing," "comparing," "using," "incrementing," "decrementing," "displacing," "deleting," "moving," "updating," "managing," or the like, refer to the actions and processes of an electronic computing device. The electronic computing device manipulates and transforms data represented as physical (electronic) quantities within the electronic computing device's registers and memories and/or hardware into other data similarly represented as physical quantities within the memories, registers and/or hardware. In some embodiments such an electronic computing device is included within, coupled with, or takes the form a computer system, a data storage system, a server, a storage area network, and/or a deduplication engine (or portion thereof), or some combination of the foregoing.

Overview of Discussion

As described above, in some implementations of deduplication engines it is desirable to move some data that would conventionally be found only in a primary index to alternate storage locations outside of the primary index. Such storage outside a primary index can be referred to by many names. Examples herein describe such storage outside of a primary index as being cluster headers; however other storage locations with other names can be used in a similar fashion to the described example embodiments.

In one embodiment, the outside storage location includes a sequential representation of blocklets of a previously deduplicated data stream (e.g., a sequence of signatures of the blocklets along with pointers to the stored data of the blocklets). After finding an initial blocklet's signature value, such as a hash value, in this sequential representation, a time savings and computational savings is realized if the signature for the next blocklet from a data stream currently being deduplicated happens to be a sequential repetition of the previously seen data stream that is represented sequentially in the outside storage. As a fair amount of stored data tends to be data that is repetitive in nature, such use of storage outside the primary index can generate an overall gain in deduplication efficiency.

However, data that is stored often involves small changes from previously stored data. This can result in a new, branching sequence of data being inserted into a previously seen and deduplicated data stream. Such changes can occur, for example, when a stored file is revised or modified by a user. These branches from the parent data stream may be repeated multiple times in future data streams that are analyzed for deduplication. During deduplication, these branches from a previously seen parent data stream can cause inefficiencies if an inefficient mechanism, such as a random search of the primary index, is required for identifying previously deduplicated blocklets that are not stored in the sequence of the parent data stream.

Herein, methods and systems are presented which describe how to create and manage links, such as a link from a parent data stream to a branch data stream. Creation and management of such links in a storage location outside of a primary index, such as in a cluster header, offers an opportunity to efficiently link to a representation of a previously deduplicated branch data stream (or at least to investigate the opportunity for such a link) before resorting to a less efficient mechanism. Thus, such linking can enable deduplicating of one or more blocklets that branch away from a previously deduplicated parent data stream, without reference back to a primary index. Instead, a link may be provided to another location in storage outside the primary index where information regarding a previously deduplicated branch from a parent data stream is stored.

Discussion will begin with description of a deduplication link creation and management system and its constituent components. The system will be further described with reference to portions of an example deduplication engine. The system will be described in more detail in conjunction with description of example methods of linking to information in a deduplication data sequence, informed deduplication link management, and linking to deduplication information. The discussion will conclude with a description of an example computer system with which, or upon which method and/or system embodiments of the present invention may be implemented.

Example Deduplication Link Creation and Management System

FIG. 1 is a block diagram of an example deduplication link creation and management system 100, according to an embodiment. As shown in FIG. 1, in one embodiment, deduplication link creation and management system 100 includes a branching point identifier 110, a branch location identifier 120, a signature value determiner 130, and signature comparer 131; all used for creating and/or following link information. In one embodiment, system 100 further includes a returning point identifier 111. In one embodiment, branching point identifier 110, further includes or performs the functions of returning point identifier 111. In one embodiment, system 100 includes a return location identifier 121. In one embodiment, branch location identifier 120 includes or performs the functions of return location identifier 121. In an embodiment where links are to be managed as well as created and followed, system 100 further includes link value storer 150, link value updater 160 and link information manager 170. All of these portions of system 100 are communicatively coupled to one another, such as via a common bus, as required to perform link creation and management. In various embodiments, these described portions of system 100 are implemented as hardware, a combination of hardware and firmware, and/or a combination of hardware and software (e.g., computer implemented instructions to be implemented by processor 606A of computer system 600 shown in FIG. 6).

Figure 6:
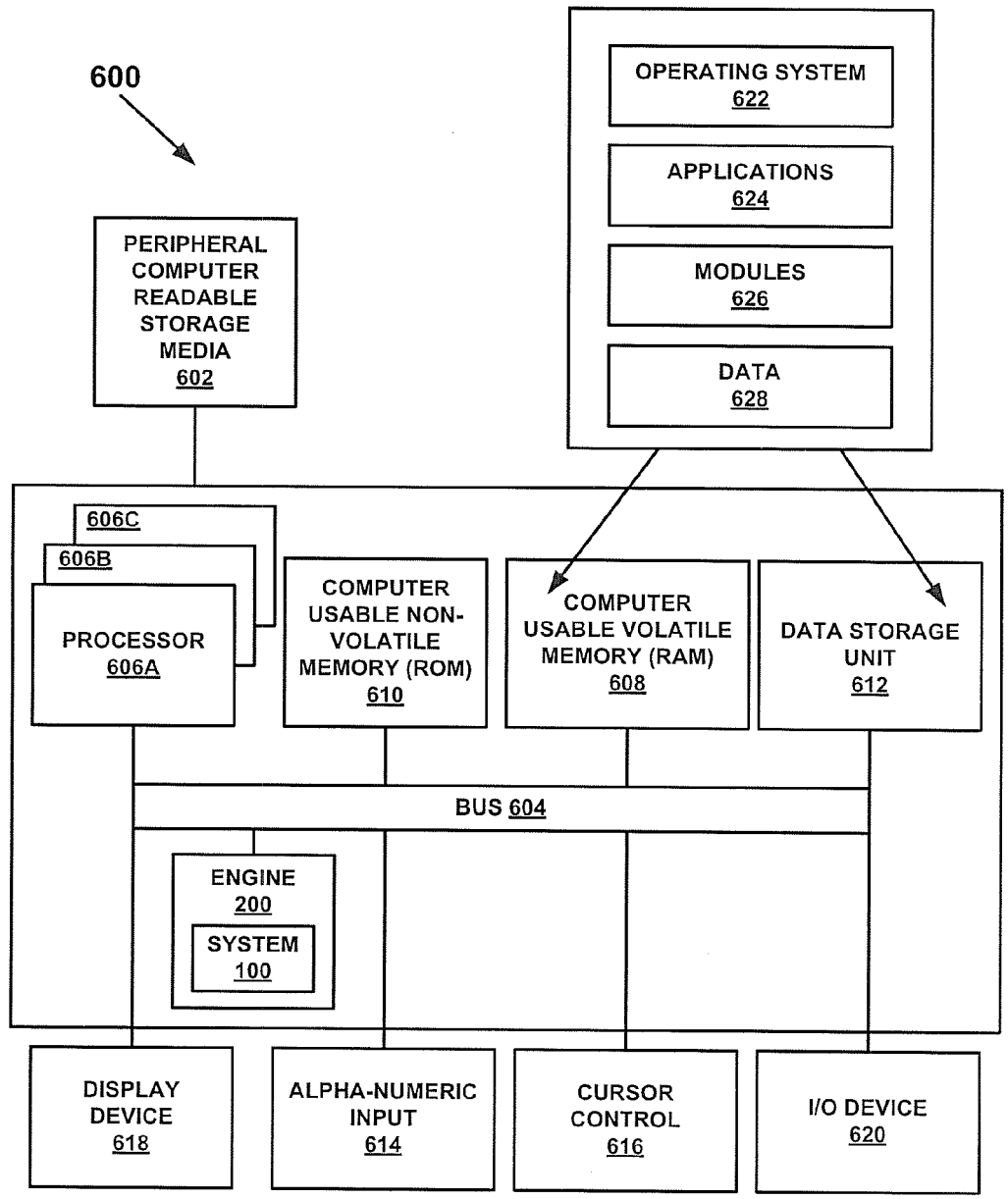
FIG. 6 illustrates an example computer system, according to an embodiment, with which or upon which various embodiments of the present invention can be implemented.

It is appreciated that, in an embodiment, deduplication link creation and management system 100 is coupled with or a part of a computer system, such as computer system 600 (described further in FIG. 6). In one embodiment this includes a commutative coupling to a random access memory, such as RAM 608, in which information, such as link information, can be stored, accessed, and managed. It is appreciated, that deduplication link creation and management system 100 is also communicatively coupled with a durable storage such as a data storage unit 612 (see FIG. 6) where a variety of information such as link information is typically stored after creation in RAM 608. It is appreciated that data storage unit 612 may comprise, but is not limited to, a hard disk drive, a plurality of hard disk drives, or a storage area network.

With continued reference to FIG. 1, in one embodiment, branching point identifier 110 operates to identify a branching point where a branch data sequence diverges from a parent data sequence that has been previously stored in a data deduplication process. In one embodiment, branching point identifier 110 is implemented as a portion of a computer system, such as computer system 600. The branching point is a point, such as an address, located with respect to the previously stored parent data sequence or representation thereof (i.e., a sequence of the signature values of consecutive blocklets of the parent data sequence). Consider as but one example, a parent data sequence that represents a file that has been stored and then deduplicated. In one embodiment, a branch data sequence that branches from this parent data sequence may then represent a modified portion of a later modified (and then stored) version of the same file. Consider a very simplified example in which a parent data sequence is represented by the sequence: 1, 2, 3, 4, 5, 6, 7, 8, 9; and a modified data sequence is represented by the sequence 1, 2, 3, 7, 5, 9, 2, 4, 5, 6, 7, 8, 9. In the modified data sequence, the modified portion 7, 5, 9, 2 branches away after the initial portion 1, 2, 3 and returns to the parent data sequence to finish out with 4, 5, 6, 7, 8, 9. When deduplication is performed on the data of this later modified file, the data of the later modified file follows the parent data sequence until the point where the modification occurred (the branching point in this example), after which the data of the later modified file diverges from the parent data sequence. In some embodiments, branching point identifier 110 can similarly be used to identify a branching point within a branch data sequence to a second branch data sequence (and so on).

Returning point identifier 111 identifies a returning point where the branch data sequence returns to the parent data sequence. In one embodiment, returning point identifier 111 is implemented as a portion of a computer system, such as computer system 600. The returning point is a point, such as an address, located with respect to a previously stored branch data sequence or representation thereof. At this returning point the branch data sequence branches back or returns to the parent data sequence.

Branch location identifier 120 operates to identify a branch location where the information of a branch data sequence begins. In one embodiment, the branch location comprises a place, such as an address where the information of the branch data sequence begins. In one embodiment, branch location identifier 120 is implemented as a portion of a computer system, such as computer system 600. In some embodiments branch location identifier 120 searches for the branch location or notes its location when it is initially stored. In other embodiments branch location identifier 120 receives the branch location from some portion of a deduplication engine (e.g., deduplication engine 200 of FIG. 2) that searches for and finds the branch location.

Return location identifier 121 identifies a return location in the parent data sequence. The return location is a place, such as an address in the parent data sequence where the branch data sequence returns from the returning point (in the branch data sequence) to resume or pick up again in the parent data sequence. As both branching and returning are data dependant phenomena, it is appreciated that in some embodiments and on certain occasions, a branch data sequence may not return or revert back to the parent data sequence. In one embodiment, return location identifier 121 is implemented as a portion of a computer system, such as computer system 600. In some embodiments return location identifier 121 searches for the branch location or notes its location when it is initially stored. In other embodiments return location identifier 121 receives the branch location from some portion of a deduplication engine (e.g., deduplication engine 200 of FIG. 2) that searches for and finds the return location.

Figure 2:
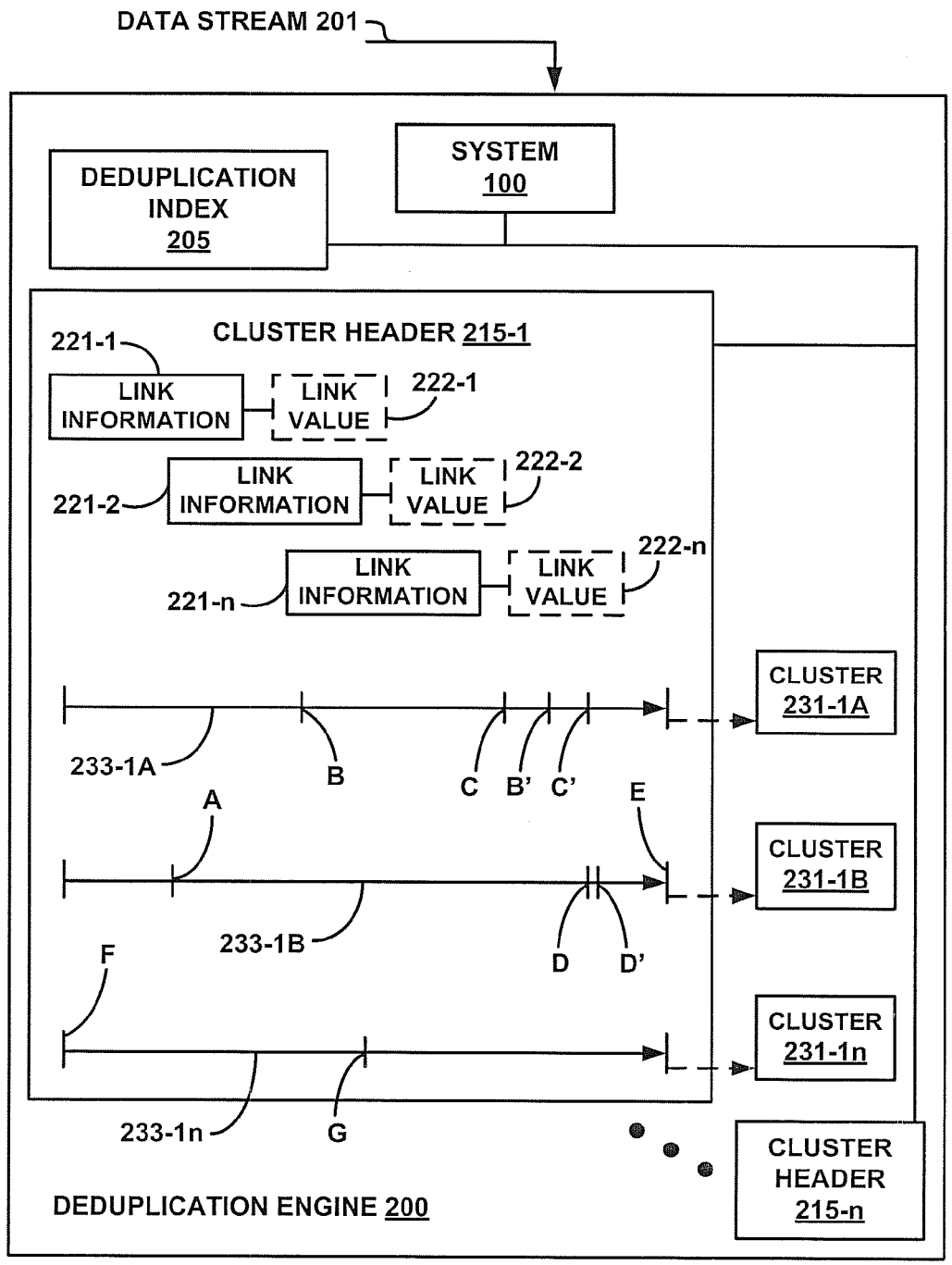
FIG. 2 is a block diagram of a portion of an example deduplication engine, according to an embodiment.

Signature value determiner 130 determines a signature value, such as a hash value, that is associated with a subsequence of the information represented in a branch data sequence. It is appreciated that in some embodiments, the signature value can comprise something other than or in addition to a hash value that provides a summary or characterization of a range of information (e.g., the head subsequence of the branch data sequence) against which a comparison can be made. The signature value may be for a "head" region/subsequence of the information of the branch data sequence. The head subsequence may be a single initial blocklet of branch data sequence, a portion of the initial blocklet, or some portion or portions of one or more of the first several blocklets of the branch data sequence. In one embodiment, signature value determiner 130 determines a signature value, such as a hash value that is associated with a resuming blocklet or range of information represented at a return location in a parent data sequence. In one embodiment, the determining comprises generating the signature value, such as hashing on a blocklet or blocklets or a portion of a blocklet/blocklets to generate a hash value. In one embodiment, the determining comprises referencing a stored signature value of a blocklet, such as a hash value or other identifying information stored at an address of a branch location or a return location. In one embodiment, signature values for blocklets may be available from another location as a side effect of processing blocklets for deduplication. In one embodiment where signature values are available from another location, signature value determiner 130 determines a signature value by acquiring the existing signature value from this other location. In one embodiment, where signature values are available from another location, all or part of the functions of signature value determiner 130 may be perform by an existing portion of deduplication engine 200 (FIG. 2). In one embodiment, signature value determiner 130 is implemented as a portion of a computer system, such as computer system 600.

In a similar manner, signature value determiner 130 can, in one embodiment, determine a signature value associated with a "tail" or end region/subsequence of a branch data sequence. This tail may comprise the final blocklet, final several blocklets, or portion/portions of the final blocklet and/or final several blocklets of the branch data sequence. Although the description herein utilizes examples that concentrate on matching information to a portion of a signature value associated with a head of a branch data sequence, it is appreciated that in various embodiments, matching can be performed in a similar fashion to a portion of a signature value that is associated with the tail of a branch data sequence. Because processing of a data sequence does not have to be performed perfectly sequentially and because there is typically a large amount of buffer memory available in a broader system in which deduplication is performed, matching to a signature value of a tail of a branch data sequence can be performed instead of (or in addition to) matching to a portion of a signature value associated with a head of a branch data sequence.

Signature comparer 131 compares a signature value (or portion thereof) with another signature value (or portion thereof) to determine if they match or do not match. For example, in one embodiment, this can comprise comparing a first hash value with a second hash value. In another embodiment, this can comprise comparing a portion of a first hash value (such as the first 6 bytes of a 16-byte hash value which may have been stored) with an equivalent portion of a second hash value. Although shown as a portion of link signature value determiner 130, it is appreciated that signature comparer 131 may be implemented apart from signature value determiner 130. In one embodiment, signature comparer 131 is implemented as a portion of a computer system, such as computer system 600.

Link information storer 140 stores link information in a computer memory, such as RAM 608. This link information may also be stored in a mass storage, such as on a hard disk drive or other mass storage. In one embodiment, the link information is stored in a cluster header for a cluster that holds the parent data sequence. In one embodiment, the link information comprises a link to the previously described branch location and also comprises a portion of a signature value of a head of the information represented at the branch location. The portion of the signature value may be all of the signature value or some subset, such as the first 12 bits of a 16-byte hash value, some combination of bits of a hash value and other summarizing/characterizing information, or some subset of summarizing or characterizing information regarding the head of a branch data sequence. In one embodiment, link information storer 140 is implemented as a portion of a computer system, such as computer system 600.

Link value storer 150 stores an initial value as a link value associated with an item of link information. In one embodiment link value storer 150 stores this link value when the item of link information with which it is associated is initially stored. This link value provides a usefulness ranking for the stored item link information. In one embodiment, the higher the link value, the more useful that an item of link information is deemed to be. In one embodiment, link value storer 150 is implemented as a portion of a computer system, such as computer system 600.

Link value updater 160 updates a stored link value over time based upon usefulness of the link information with which the link value is associated. In one embodiment, link value updater 160 updates the link value over time, such as by incrementing the link value associated with an item of link information each time that the link information is successfully employed to link to a branch data sequence and/or decrementing the link value over time as it ages with non-use or does not succeed in providing a link to a branch data sequence. In one embodiment, link value updater 160 is implemented as a portion of a computer system, such as computer system 600.

Link information manager 170 uses the link value to inform competitively managed retention of a plurality of link information stored in the computer memory. For example, in a memory or storage of a fixed size (e.g., a cluster header) there may only be room to store a limited amount of link information. In one embodiment, when there is not sufficient room to add a new item of link information, link information manager 170 compares the link values of the currently stored items of link information. In one embodiment, an item of link information that has the lowest link value is removed to make room for a new item of link information. In one embodiment, in the case of a tie for the lowest link value, link information manager 170 employs a tie breaking procedure. For example, in one embodiment, link information manager 170 removes the oldest item of link information from among the items of link information that are tied for the lowest link value. In one embodiment, link information manager 170 is implemented as a portion of a computer system, such as computer system 600.

Example Deduplication Engine

FIG. 2 is a block diagram of a portion of an example deduplication engine 200, according to an embodiment. It is appreciated that FIG. 2 is a very high level block diagram and many portions of deduplication engine 200 are either omitted or not described in detail so as not to obscure aspects of embodiments of the present invention. In one embodiment, deduplication engine 200 includes a deduplication index 205 (e.g., a primary index), a plurality of cluster headers 215-1 to 215-n, and system 100, all of which are communicatively coupled with one another. As shown in FIG. 2, a cluster header 215 is associated with and serves as a header for a plurality of clusters 231 (e.g., cluster header 215-1 is associated with and serves as a header for clusters 231-1A, 231-1B ... 231-1n). It is appreciated that a cluster 231 may also be referred to as a cluster body. A cluster represents a storage area where a representation of deduplicated data is/was sequentially stored after being deduplicated from a data stream 201 (this may include actual data and pointers). A cluster header 215 includes a variety of information about the clusters that it is associated with. For example, as shown in FIG. 2, in one embodiment, cluster header 215-1 includes a plurality of link information 221 (e.g., link information 221-1, 221-2 ... 221-n). In one embodiment, each item of link information 221 also includes an associated link value 222 that provides a valuation (e.g. a numerical value) that assesses the overall usefulness of the link information 221 with which the link value 222 is associated. In FIG. 2, for example, link value 222-1 is associated with link information 221-1, link value 222-2 is associated with link information 221-2, and link value 222-n is associated with link information 221-n. In one embodiment, system 100 is utilized to manage which link information is kept in a cluster header 215 and which is removed or moved to another location outside of cluster header 215.

It is appreciated that a cluster header 215 and its associated clusters may reside in mass storage, such as on a hard disk drive. In one embodiment, a cluster header 215 is retrieved from mass storage and moved to a random access memory (e.g. RAM 608) for quicker access when a blocklet of data from data stream 201 is identified as having a signature for a blocklet that is stored in one of the clusters 231 that are associated with a cluster header 215. It is appreciated that, when used in this fashion, cluster headers 215 represent an extra level of indirection between deduplication index 205 and the actual storage location of the information of a deduplicated blocklet of data.

In one embodiment, stored sequences 233 (e.g., 233-1A, 233-1B ... 233-1n) are part of a cluster header 215, and each stored sequence (e.g. 233-1A) represents the sequentially stored signature values of the actual data blocklets which are stored/represented in an associated cluster 231 that typically resides in mass storage (e.g., on a hard disk drive). For example, stored sequence 233-1A is associated with cluster 231-1A, stored sequence 233-1B is associated with cluster 231-1B, and stored sequence 233-1n is associated with cluster 231-1n. The signature values, such as hash values, are signatures of blocklets of a data stream 201. In one embodiment, these signature values are stored in sequence in the stored sequences 233, with each signature value being stored in association with a pointer to the actual location of the information of the blocklet in a cluster 231 (the actual location is typically an address in mass storage such as on a disk or in a storage area network). Such sequential storage of signature values in a particular stored sequence 233 continues until an associated cluster 231 is filled. In one embodiment, the sequential storage then continues in another stored sequence 233 that is associated with another cluster 231. Although stored sequences 233-1A, 233-1B, and 233-1n are shown as separate entities, it is appreciated that a cluster header 215 may comprise one long stored sequence that is associated with a plurality of clusters 231 (e.g. 231-1A, 231-1B, and 231-1n).

Apart from the language used herein, it is appreciated that "pointers" to the actual data from a stored sequence 233 can be other kinds of identifiers, in some embodiments. For example, the embodiments described herein would also be applicable in a massive distributed storage system where the hash value themselves might be used to locate the data and the sequence data of the stored sequences 233 may be the copy of the sequence used to identify actual file contents.

Because signature values for blocklets of a previously deduplicated data stream are stored sequentially in a stored sequence 233, once a signature value for a blocklet in a follow-on data stream 201 is identified in a stored sequence 233 as matching a signature value from a previously deduplicated data stream, it is computationally efficient to compare the signature value of the next blocklet to the stored signature value of the next sequentially stored signature value that is in stored in the stored sequences 233 of a cluster 231. This is much faster than performing a random search across deduplication index 205 in an attempt to locate this next signature value. In such an embodiment, a portion of the stored sequence 233 of a cluster 231 represents a parent data sequence that blocklets of a follow-on data stream 201 are being matched against during deduplication. This sequential matching against the parent data sequence can continue until the data sequence of the currently being deduplicated data stream 201 deviates from the previously deduplicated parent data sequence. When such a deviation occurs, frequently it is due to a variation in a later data stream 201, as compared to a previously deduplicated data stream (which may be referred to herein as a parent data sequence). As previously described, this new information which deviates from the previous data stream is referred to herein as a branch data stream or a branch data sequence.

With reference to FIG. 2, consider an example, where a parent data stream is represented as the stored sequence 233-1A of cluster 231-1A. While data stream 201 is being deduplicated by deduplication engine 200, sequential blocklets of information match those of stored sequence 233-1B until branching point "A" is reached. Through searching of stored sequences 233-1A through 233-1n or via other mechanism such as random searching of deduplication index 205, it is determined that a branch data sequence begins at location "B" in stored sequence 233-1A. In one embodiment, branching point identifier 110 identifies point "A" as a branching point in the parent data sequence represented by stored sequence 233-1B, branch location identifier identifies location "B" as the starting point of a branch data sequence that branches from branching point A, and signature value determiner 130 determines a signature value (e.g., a hash value) associated with the first blocklet (or in other embodiments the second blocklet, or some combination or subset of the first several blocklets or portions thereof) of the branch data stream starting at branch location B. Link information storer 140 then stores link information 221-1 in cluster header 215-1, so that on a subsequent deduplication pass along the parent data sequence, represented by a portion of the stored sequence 233-1B, there will be a link from the address of point A to the address of location B. In one embodiment, link information storer 140 also stores in link information 221-1 a portion of the signature value of the head of a branch data sequence that begins at location B. For example, in one embodiment, this can comprise storing a portion of the hash value of the initial blocklet of the sequence that begins at location B. The portion of the signature value that is stored in the link information can vary from one bit of the signature value to the entirety of the signature value, with more bits/bytes being used to ensure a higher likelihood of the link being valid. In one embodiment, link value storer 150 also stores a threshold initial value as link value 222-1. This threshold initial value can be a default value or an initial estimate of the link value based upon information then available to the system, such as the lengths of the subsequences under consideration and/or the methods by which their constituent blocks were located.

Following this same example, on a subsequent pass along the parent data stream, if a divergence occurs at point A, deduplication engine 200 can search cluster header 215-1 for link information associated with point A. To determine if link information 221-1 from point A to location B should be followed, signature comparer 131 compares a signature value for the next blocklet (the divergent blocklet) with the portion of a signature value that is stored with link information 221-1. If there is a match, then there is a high confidence that this will be a successful link and deduplication engine 200 checks location B to see if the branch data sequence continues at the address of location B. In other embodiments, instead of making the comparison to the next blocklet, signature comparer 131 compares a signature value for the second blocklet following the divergence, or some combination or subset of the first several blocklets or portions thereof following the divergence.

In one embodiment, if the link information 221-1 is used to successfully link to location B, link value updater 160 increments link value 222-1 by some amount to increase the link value 222-1 associated with link information 221-1. In one embodiment, if link information 221-1 is not successfully employed to link to location B, link value updater 160 decrements link value 222-1 by some amount to decrease link value 222-1. In one embodiment, as time passes without use of link information 221-1, link value updater 160 decrements or decays link value 222-1 to indicate a decreased value with age and non-use. This decay can be a fixed amount per unit of time or can be an increased decay as more time passes (e.g., a linear increase in decay with time with non-use or an exponential increase in decay with increased time of non-use).

In another embodiment the physical update of the link value and the logical update of the link value are decoupled. Consider, as an example, a decoupled embodiment where a value and a time of last update are both stored, the value is decremented (or decremented, or decayed) according to the time of last update. In one such decoupled embodiment, the physical decrementing is applied to the link value when a write to the data structure is otherwise motivated. The decrementing of the link value may also be randomized, approximated, and/or estimated in order to save space and/or time, in some embodiments, when precision is not a controlling or over important requirement. For example, when space is short (e.g., saving space is a more important consideration than having very accurate link values) very small counters that go up and down may be used. These very small counters are physically altered on randomized occasions such that the link values of these counters move up and down between integer quantities with probabilities depending on the true, possibly factional, value of the computed adjustment at that time.

In the event there is no match or if after checking at location B the branch sequence does not continue, a spectrum of options are available before reverting to randomly searching deduplication index 205 for the signature value associated with the divergent blocklet. In one embodiment, for example, other stored sequences 233 of cluster header 215-1 are searched. In one embodiment, other link information 221 stored in RAM 608 or other readily accessible memory is searched. In one embodiment, if stored sequences 233 of other cluster headers (e.g. cluster header 215-n) are loaded into RAM 608 or other readily accessibly memory, they and their associated stored sequences 233 are searched for the signature value of the divergent blocklet. One or more of such a spectrum of options may be employed before reverting to deduplication index 205.

Example Methods of Operation

Flow diagrams 300, 400, and 500 include processes that, in various embodiments, are carried out by a processor under the control of computer-readable and computer-executable instructions. In some embodiments, this comprises a processor that is in, or used to implement one or more functions of a storage system such as storage area network. In some embodiments, this includes a processor, such as processor 606A, located in a computer system, such as computer system 600 (FIG. 6). It is appreciated that the computer-readable and computer-executable instructions for executing the method illustrated by flow diagram 300, the method illustrated by flow diagram 400, or the method illustrated by flow diagram 500 reside, for example, in any tangible computer-readable storage media. Some examples of suitable computer-readable storage media include, but are not limited to, a compact disk read only memory (CD-ROM), a read only memory, a random access memory, and a magnetic storage medium (e.g., a disk or a tape). In some embodiments such computer-readable and computer-executable instructions, reside on computer-readable storage media such as a ROM or firmware of a processor or application specific integrated circuit (ASIC).

Although specific flows of procedures are disclosed in flow diagrams 300, 400, and 500, such flows are provided for example. That is, embodiments are well suited to performing various other procedures or variations of the procedures recited in flow diagrams 300, 400, and 500. It is appreciated that, in some embodiments, the procedures in flow diagrams 300, 400, and 500 may be performed in different orders than presented, and that not all of the procedures in flow diagrams 300, 400, and 500 may be performed in every embodiment.

Example Method of Classifying Data for Deduplication

FIGS. 3A, 3B, and 3C illustrate a flow diagram 300 of an example method of linking to information in a deduplication data sequence, according to an embodiment. In various embodiments, the method of flow diagram 300 is implemented with system 100 of FIG. 1, deduplication engine 200 of FIG. 2, and/or is implemented by or as instructions performed by a computer system, such as, for example, computer system 600 (see FIG. 6). Reference will be made to previously described elements of FIGS. 1 and 2 in the description of the method illustrated in flow diagram 300. It is appreciated that the method of flow diagram 300 is implemented at a time following the storing of a data sequence that then becomes a "parent data sequence" on the second and additional times that it is referenced during deduplication activities.

At 310 of flow diagram 300, in one embodiment, the method identifies a branching point where a branch data sequence diverges from a parent data sequence that has been previously stored in a data deduplication process. In one embodiment, branching point identifier 110 identifies the branching point. In one embodiment, the branching point comprises an address associated with a storage location outside of a primary index of a deduplication engine. For purposes of example, and not of limitation. In one embodiment, branching point identifier 111 identifies an address associated with branching point A in the stored sequence 233-1B.

It is appreciated that in some embodiments, a branching point may be located within a parent data stream, such as at point A, or at the end point of a parent data stream, such as at point E. In many embodiments, the stored parent data sequence will simply continue at the beginning of the next cluster, such as at the address associated with beginning point F in stored sequence 233-1*n*. However, this may not always be the case. When this is not the case, identification of an end point, such as end point E, facilitates the storage of a chaining pointer as link information 221. Such a chaining pointer is stored in association with point E and points to a location, such as the address of location F or location G, or whatever point at which the parent data sequence continues. For consistency and simplicity of design, in some embodiments, even if it occurs that one cluster does just follow onward from another, link information 221 is associated still associated with the end of one cluster's stored sequence to indicate a link to the beginning of the follow-on cluster's stored sequence. This can be useful in many situations, such as, but not limited to a situation where multiple data streams are being processed simultaneously for deduplication (a likely event in a large deduplication engine/large storage system). When processing multiple data streams, the next available cluster to store a representation of a data stream may not in fact be the next in logical sequence, and thus employing link information 221 can aid in follow-on use of the stored sequence information.

At 320 of flow diagram 300, in one embodiment, the method determines a signature value associated with a subsequence of the information represented in the branch data sequence. The subsequence for which the signature value is determined can be a head or tail subsequence, or both. In one embodiment, for example, signature value determiner 130 determines this signature value, which may be a hash value or other similar coded value that represents the initial blocklet of data or some other portion/portions of a range of data at the beginning/"head" of end/"tail" of a branch data sequence. Consider an embodiment, for example, where the next blocklet of information that diverges from a parent data stream to become a branch data stream is an 8-kilobyte blocklet. In one such embodiment, signature value determiner 130 determines a signature value for this blocklet as being a 16-byte hash value. This 16-byte hash value is generated in one embodiment by deduplication engine 200 as part of its normal course of deduplication and is simply obtained by signature value determiner 130. In another embodiment, signature value determiner 130 hashes the 8-kilobyte blocklet to generate the hash value of the blocklet if it is not readily available from another source or location. It is appreciated that the length of a blocklet may vary from approximately 1-kilobyte to 1-Megabyte, but that other sizes are possible. It is appreciated that the lengths of blocklets are, in various embodiments, either fixed or variable, and wide variation in size is possible.

At 330 of flow diagram 300, in one embodiment, the method identifies a location where the information of the branch data sequence begins. In one embodiment, branch location identifier 120 identifies this branch location. It is appreciated that the branch location comprises an address associated with a storage location outside of a primary index of a deduplication engine. By "associated with" what is meant is that in, various embodiments, the address is the address of the storage location; the address is adjacent to the address of the storage location (for example the address before or after the address of the storage location); is near to (e.g., on the same memory page in a solid state memory, or within several addresses before or after the actual storage location); and/or is connected to the address of the storage location through some arrangement of pointers. With reference to FIG. 2, as but one possible example, it will be assumed that location B represents a branch location. However, it is appreciated that the branch location may be located in a cluster associated with another cluster header (e.g., cluster header 215-*n*) and that there may be multiple branch locations associated with a branching point. In one embodiment, branch location identifier 120 searches through cluster headers 215 and stored sequences 233 to find branch location B. In another embodiment, another mechanism, such as a random search of deduplication index 205 finds location B and branch location identifier 120 notes the branch location. In one embodiment, branch location identifier 120 identifies a branch location when the branch data sequence is initially deduplicated.

At 340 of flow diagram 300, in one embodiment, the method stores link information in a computer memory. The link information is stored in association with the identified branching point. The link information comprises a stored link, such as a pointer, to the branch location. In one embodiment, the link information also comprises a portion of the signature value (e.g., a portion of the hash value) of the information (such as the head subsequence) represented at the branch location. In one embodiment, link information 221 is stored in a storage area that is outside of deduplication index 205, such as in a cluster header 215 that includes metadata regarding a plurality of deduplication clusters. In one embodiment, the cluster header 215 in which a particular item of link information 221 is stored, serves as cluster header 215 for the cluster 231 in which the branching point resides.

Following the previous example, in one embodiment, link information storer 140 stores link information 221-1 and associates link information 221-1 with the address of branching point A. In one embodiment, link information storer 140 also includes in link information 221-1 a portion of the signature value of the head of the branch data sequence which begins at branch location B. As previously described, the "head" can comprise the initial blocklet or some other range of information at the beginning of the branch data sequence. Consider an embodiment where the signature value is based on the hash value of the first blocklet of information of a branch data sequence. In one such embodiment, if signature value determiner 130 determines that the first blocklet of data at branch location B has a 16-byte hash value, then as little as one bit or as many as the entire sixteen bytes of this hash value can be stored with link information 221-1. In order to conserve storage space, in one embodiment, only a subset of signature value is stored in link information 221-1. For example, in one embodiment, if the hash value is 16 bytes long, then in one embodiment the only the first 5 bytes are stored with link information 221-1. In various embodiments, the number of bits/bytes of the signature value to be stored with link information 221 is preset, is adjustable by a user, or is adjusted automatically according to some predetermined policy (e.g., decreased in response to a decrease in storage space availability). As the stored portion of the signature values is used for comparison purposes, it is appreciated that increasing the number of bits/bytes of the signature value which are stored is a mechanism for increasing the confidence that following the link is a correct decision. The tradeoff is that storing more bits/bytes consumes more storage space, such as in a cluster header 215 and the comparison process possibly takes more time and computational resources.

In one embodiment, the method of flow diagram 300 further includes procedures used in follow-on deduplication activities that again reference an identified branching point. One such embodiment is described by the procedures shown in FIG. 3B.

With reference to FIG. 3B, at 353 of flow diagram 300, in one embodiment, during a follow-on deduplication activity involving reference to a previously identified branching point of the parent data sequence, the method compares a second signature value associated with a next blocklet to be deduplicated in the follow-on deduplication activity to determine if the previously stored portion of the branch location signature value matches with a like range of the second signature value. By associated with the next blocklet, what is meant is that the signature value can be the signature value of this next blocklet or of some range of blocklets (e.g., what may be found to be the head of a deviating branch data sequence) that includes this next blocklet. In one embodiment, signature comparer 131 performs this comparison. Consider an embodiment that follows the previous example involving on branching point A and branch location B, in which 5 bytes of a 16-byte signature value were stored with link information 221-1. In one such embodiment, a parent data sequence represented by stored sequence 233-1B is being followed during a deduplication activity and a deviation from the parent data sequence is noted at branching point A. Deduplication engine 200 references link information 221-1, which is associated with branching point A. To determine if the deviating blocklet is likely to be found at branch location B, in one embodiment, signature comparer 131 accesses link information 221-1 and compares the stored portion of a signature value to a like range of the signature value of the deviating blocklet/head of the deviating branch data sequence to determine if there is a match.

At 355 of flow diagram 300, in one embodiment, in the event of the stored portion of the signature value matching a like range in the signature value of the deviating blocklet/head of the branch data sequence, the method uses the link information to branch to the branch location to continue with the follow-on deduplication activity. Following the previous example, if the comparison generates a match, then deduplication engine 200 follows the link from branching point A, provided by link information 221-1, and proceeds to branch location B. At branch location B, deduplication engine 200 attempts to continue deduplication by matching signature values of blocklets with information stored sequentially in a branch data sequence that is recorded in stored sequence 233-1A.

In the event that matching does not occur when the comparison is made, a variety of actions can be taken by deduplication engine 200 prior to reverting to deduplication index 205 to perform a random search for a signature value. In one embodiment, a list of possible actions is arranged from the quickest and least computationally expensive to try to the slowest and most computationally expensive to try. Deduplication engine 200 then begins attempting actions from the list in order of quickest to slowest, in an attempt to locate the signature value of a deviating blocklet that is being deduplicated. By way of example and not of limitation, in one embodiment, deduplication engine 200 first searches all link information in a cluster header 215 (e.g., cluster header 215-1) associated with the cluster (e.g., cluster 231-1B) where the data of a parent data sequence is stored/represented; then searches the remainder of stored sequence (e.g., stored sequence 233-1B) of the cluster for the signature value; then searches other stored sequences (e.g., 233-1A ... 233-1n) that share the same cluster header (e.g., 215-1); and then searches other cluster headers 215 and stored sequences 233 that are presently loaded into memory (e.g., RAM 608); and if all these options fail, then searches deduplication index 205. It is appreciated that other such prioritized actions lists may be created and employed in this manner and that these lists may contain more, fewer, or different options, or list options in a different order.

In one embodiment, the method of flow diagram 300 further includes procedures used in deduplication activities that follow after a branch data sequence has been identified. One such embodiment is described by the procedures shown in FIG. 3C.

At 362 of flow diagram 300, in one embodiment, the method identifies a returning point where the branch data sequence returns to the parent data sequence. In one embodiment, returning point identifier 111 identifies this returning point. With reference to FIG. 2, consider an embodiment which follows the previous example, where a branch data sequence has been identified that starts at branch location B in stored sequence 233-1A. In one embodiment, a divergent signature value is identified after a period of matching signature values of blocklets of data stream 201 to the stored signature values in the branch data sequence. This divergence occurs at the address associated with point C. If searching by deduplication engine 200 or return location identifier 121 indentifies that the signature value associated with this divergent blocklet resides for example at location D of the parent data sequence, then returning point identifier 111 identifies point C as a returning point.

At 364 of flow diagram 300, in one embodiment, the method identifies a return location in the parent data sequence where the branch data sequence returns from the returning point to resume following the parent data sequence. In one embodiment, return location identifier 121 locates this return location. This locating may be dependent upon or performed in conjunction with other searching/identification functions of deduplication engine 200. With reference to the previous example, in one embodiment, return location identifier 121 identifies the address of location D as the return location where the branch data sequence represented by range B-C of stored sequence 233-1A resumes following the parent data sequence represented in stored sequence 233-1B.

At 366 of flow diagram 300, in one embodiment, the method determines a return location signature value of a blocklet of information represented at the return location. In one embodiment, signature value determiner 130 determines the signature value of at least the initial blocklet or some other range of data or portion/portions thereof located at or in the vicinity (e.g., within a several blocklets) of the return location address. This is accomplished in the same fashion as has been previously described in conjunction with the operation of signature value determiner 130 determining a signature value for the head subsequence of a branch data sequence at a branch location.

At 368 of flow diagram 300, in one embodiment, the method stores additional link information in the computer memory. This additional link information is stored in association with the returning point, such as returning point C. For example, in one embodiment link information storer 140 stores link information 221-2 in a location that is outside of deduplication index 205, such as, for example in cluster header 215-1. In one embodiment, link information 221-2 comprises a link, such as a pointer, to the address of the return location to the address of return location D. In one embodiment, link information 221-2 also comprises a portion of the return location signature value. This can comprise the entirety or some subset of the signature value. For example, in one embodiment, if the signature value of the head of the data sequence at the return location is a 16-byte hash value, then the stored portion can be anywhere between 1 and 128 bits, depending on default settings and/or user selections and/or space availability. In one embodiment, link value storer 150 also stores an initial link value 222-2 in association with link information 221-2. Storing of an initial link value 222-2 is consistent with the previous description of storing of initial link values 222.

Once link information, such as link information 221-2 has been stored in conjunction with a returning point, during follow-on deduplication activities, deduplication engine 200 can reference link information 221-2 for a possible link when a divergent blocklet is encountered at returning point C while deduplicating a sequential data sequence that follows the data sequence represented in stored sequence 233-1A.

Additionally, in one embodiment, link information 221-n can be stored indicating a return location D is associated with branching point A. In this manner, on a third or subsequent pass along stored sequence 233-1B, when a new branch is encountered at branching point A, return location D is stored as a possible return location following the end of the branch data sequence. For example, the linking from location A to location D is valuable on a third pass when branch point A branches to a branch location B' with a return point C' that returns at or near return location D (which is a likely occurrence in a follow-on data stream or later in the same data stream). Having link information 221-n available as an searchable option within cluster header 215-1 presents a mechanism for finding the return location D from return point C' without a need for reverting to the primary index. Likewise, even if the address of return location D is not the actual return location from returning point C', searching in the vicinity of the address of return location D is beneficial as it is likely to quickly turn up the actual return point D', which has a high likelihood of being in the vicinity of return location D when branching point A is a common original branching point to both return locations.

Example Method of Informed Deduplication Link Information Management

FIG. 4 illustrates a flow diagram 400 of an example method of informed deduplication link information management, according to an embodiment. In various embodiments, the method of flow diagram 400 is implemented with system 100 of FIG. 1, deduplication engine 200 of FIG. 2, and/or is implemented by or as instructions performed by a computer system such as, for example computer system 600 (see FIG. 6). Reference will be made to previously described elements of FIGS. 1 and 2 in the description of the method illustrated in flow diagram 400.

At 410 of flow diagram 400, in one embodiment, the method stores link information in a computer memory. The link information is stored in association with a diverging point from a previously stored data sequence, such as a parent data sequence or a branch data sequence. In one embodiment, the link information comprises a link, such as a pointer, to a divergent location where information of a divergent data sequence begins diverging from the diverging point. With reference to FIG. 2, in one embodiment, this comprises link information storer 140 storing link information 221-1 in association with branching point A (which comprises the diverging point). In such an embodiment, link information 221-1 comprises at least a link, such as a pointer, to branch location B (which comprises the divergent location). In one embodiment, link information 221-1 is stored outside of deduplication index 205 such as in RAM 608. For example, in one embodiment, link information 221-1 is stored in cluster header 215-1 which is maintained in RAM 608 and is also stored in mass storage, such as on a hard disk drive or in a storage area network. It is appreciated that such link information 221-1 can also be stored in association with a diverging point, such as a returning point (e.g., returning point C) or a branching point from a branch data sequence.

At 420 of flow diagram 400, in one embodiment, the method storing an updatable link value in association with the link information. The stored link value is set to an initial level upon initial storage of the link information and is updated over time based upon usefulness of the link information with which is associated. The "initial level" can be a default fixed level or value or an initial estimate of the link value based upon information then available to the system, such as the lengths of the subsequences under consideration and/or the methods by which their constituent blocks were located. In one embodiment, this comprises link value storer 150 storing the link value in a cluster header for a plurality of clusters of deduplication information, where the diverging point is included in one of the clusters served by the cluster header. Consider an embodiment, where link value storer 150 stores link value 222-1 in association with link information 221-1. In one embodiment, link value storer 150 stores an initial value as link value 222-1. This initial value may be numerical value, such as a binary value, and it is stored in conjunction with the initial storage of link information 221-1. In one embodiment, for example, a numerical value of 5, 10, 14 or some other numerical value can be initially stored as link value 222-2.

Over time, link value updater 160 updates the initially stored link value 222-2 based on the usefulness of link information 221-1. For example, if it is assumed that link value 222-2 has an initial numerical value of 17, in one embodiment link value updater 160 increments link value 222-2 by some amount, such as a numerical value of 5 for each successful use of link information 221-1. Similarly link value updater 160 decrements link value 222-2 by some value such as a numerical value of 3 for each unsuccessful attempted use. In one embodiment, link value updater 160 also decrements link value 222-2 by some amount, such as a numerical value of 1, each time a pre-defined time period, such as one hour or one day, passes with non-use of link information 221-1. It is appreciated that in this same manner, link value 222-2 may be updated (incremented or decremented) over time in response to occurrence/non-occurrence of many other pre-defined and/ or user established criteria. In one embodiment, the magnitude of the change of the amount depends on an estimate of the effort saved by the use of the link, as determined, for example, by the number of blocklets in the run indicated, the number of trips to other index structures avoided, or other such estimates of effort in the form of time and/or computational resources. It is appreciated that link values and link information for deleted data can be deleted at any convenient time, such as by link information manager 170 or some other portion of system 100.

At 430 of flow diagram 400, in one embodiment, the method uses the link value to inform competitively managed retention of a plurality of link information stored in the computer memory. By "inform," what is meant is that the link value is used to guide the competitive management. Competitive management is used when link information related to deleted data (assuming such links exist) must be sacrificed to make room for new links. This competitive management for retention can be used to determine which of a plurality of link information to remove from a particular storage location, such as to make room for other link information. In one embodiment, link information manager 170 performs this competitive management for retention. Consider an embodiment, where link information 221-1 has an associated link value 222-1 of 75; where link information 221-2 has an associated link value 222-2 of 9, and where link information 221-n has an associated link value 222-n of 32. In one such embodiment, cluster header 215-1 is full and can hold no more link information 221, but yet another link as been discovered and system 100 is trying to store link information for the discovered link. In one such embodiment, link information manager 170 determines a lowest valued item of the existing link information from the plurality of link information 221-1 . . . 221-n stored in cluster header 215-1. In this embodiment, link information 221-2 is determined to have the lowest link value 222-2 at a value of 9.

After this determination is made, link information manager 170 displaces link information 221-2 and link value 222-2.
For example, in one embodiment, link information 221-2 and link value 222-2 are displaced from cluster header 215-1 so that room can be made in cluster header 215-1 for storage of a new item of link information. Similar competitive management for retention can be performed periodically to remove low ranked link information that is below a threshold value or that is ranked below other link information maintained in a particular memory/storage location, such as cluster header 215-1. In one embodiment, the displacing of link information and/or a link value involves simply deleting these items. In another embodiment, these items are moved to a secondary storage location. This secondary storage location may reside, in one embodiment, in a neighboring cluster header 215, such as, but not limited to, a cluster header 215 that immediately precedes or immediately follows the cluster header from which the items were displaced. By moving the items to a secondary storage location, they are still available for reference and use. It is appreciated that, in one embodiment, the decision to move versus delete link information may also be made on a competitive basis by link information manager 170. For example, in one embodiment, link information manager 170 moves link information 221 if it has a link value 222 that meets or exceeds a certain threshold link value and deletes link information 221 and an associated link value 222 that falls below the threshold.

Example Method of Linking to Deduplication Information

Figure 5:
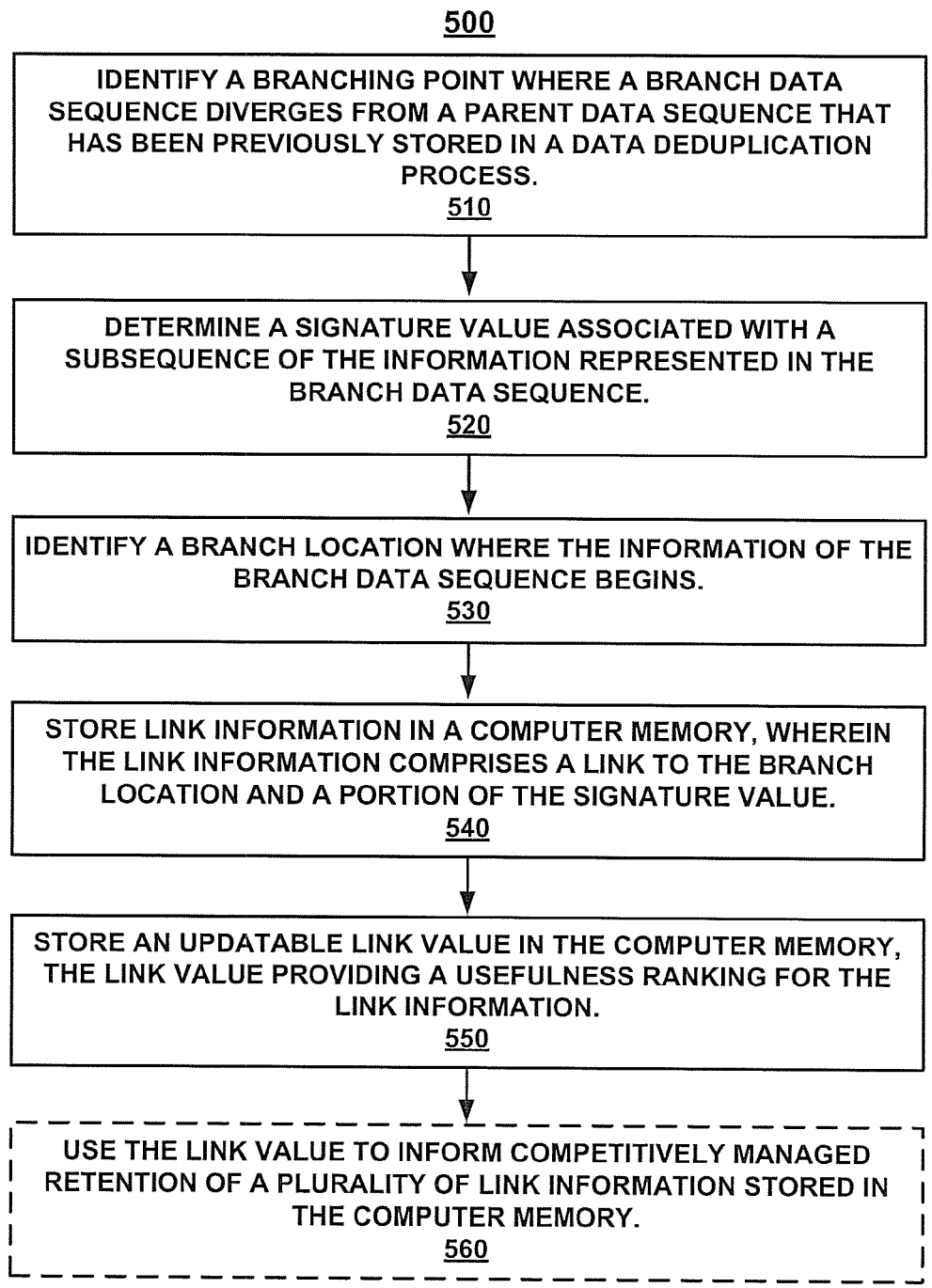
FIG. 5 illustrates a flow diagram of an example method of linking to deduplication information, according to an embodiment.

FIG. 5 illustrates a flow diagram 500 of an example method of linking to deduplication information, according to an embodiment. In various embodiments, the method of flow diagram 500 is implemented with system 100 of FIG. 1, deduplication engine 200 of FIG. 2, and/or is implemented by or as instructions performed by a computer system such as, for example computer system 600 (see FIG. 6). Reference will be made to previously described elements of FIGS. 1 and 2 in the description of the method illustrated in flow diagram 500.

At 510 of flow diagram 500, in one embodiment, the method identifies a branching point where a branch data sequence diverges from a parent data sequence that has been previously stored in a data deduplication process. In one embodiment, this comprises branching point identifier 110 identifying an address of a branching point, such as branching point A shown in FIG. 2. It is appreciated that this is accomplished in substantially the same manner as the identifying of a branching point that was described in conjunction with 310 of flow diagram 300.

At 520 of flow diagram 500, in one embodiment, the method determines a signature value associated with a subsequence of the information represented in the branch data sequence. As previously described this can comprise identifying a signature value associated with a head or a tail subsequence. In one embodiment, this comprises signature value determiner 130 determining a signature value in the manner previously described in conjunction with 320 of flow diagram 300. For purposes of example, and not of limitation, consider an embodiment where signature value determiner 130 determines a signature value, such as a hash value of an initial blocklet that is represented at the address of branch location B shown in FIG. 2. It is appreciated that in other embodiments, the signature value can be determined for other ranges of data that are at the head or tail of a branch data sequence (e.g., within the first several blocklets or last several blocklet of the branch data sequence).

At 530 of flow diagram 500, in one embodiment, the method identifies a branch location where the information of the branch data sequence begins. In one embodiment, this comprises branch location identifier 120 identifying a branch location in the manner previously described in conjunction with 330 of flow diagram 300. For purposes of example, and not of limitation, consider an embodiment where branch location identifier 120 identifies the address of location B (FIG. 2) as being the beginning of a branch data sequence that diverges from branching point A of a parent data sequence.

At 540 of flow diagram 500, in one embodiment, the method stores link information in a computer memory. The link information that is stored comprises a link to the identified branch location. In one embodiment, the link information that is stored also comprises a portion of the signature value of the head of the branch data sequence. Thus, in an embodiment where the hash value of the initial blocklet of the branch data sequence is used as the signature value, the stored link information also comprises a portion of the hash value of this initial blocklet. For purposes of example, and not of limitation, consider an embodiment where link information storer 140 stores link information 221-1 in cluster header 215-1 to describe a link, such as a pointer, from branching point A to branch location B. Link information storer 140 stores such link information in the manner previously described in conjunction with 340 of flow diagram 300 and/or 410 of flow diagram 400.

At 550 of flow diagram 500, in one embodiment, the method stores an updatable link value in the computer memory (which can include both internal and external memory stores, including remote storage). The link value provides and functions as a usefulness ranking for the link information with which it is associated. In one embodiment, this link value is stored by link value storer 150 in the manner previously described at 420 of flow diagram 400. For purposes of example, and not of limitation, consider an embodiment where link value storer 150 stores link value 222-1 in association with link information 221-1. In one embodiment, this storing further comprises link value storer 150 updating the stored link value 222-1 over time based upon usefulness of link information 221-1. In one embodiment, this updating is performed by link value updater 160, which operates in the same manner as previously described in conjunction with 420 of flow diagram 400.

At 560 of flow diagram 500, in one embodiment, the method uses the stored link value to inform competitively managed retention of a plurality of link information stored in the computer memory. In one embodiment, link information manager 170 performs this competitively managed retention in the same manner as previously described in conjunction with 430 of flow diagram 400.

Example Computer System Environment

With reference now to FIG. 6, all or portions of some embodiments described herein are composed of computer-readable and computer-executable instructions that reside, for example, in computer-usable/computer-readable storage media of a computer system. That is, FIG. 6 illustrates one example of a type of computer (computer system 600) that can be used in accordance with or to implement various embodiments which are discussed herein. It is appreciated that computer system 600 of FIG. 6 is only an example and that embodiments as described herein can operate on or within a number of different computer systems including, but not limited to, general purpose networked computer systems, embedded computer systems, server devices, client devices, various intermediate devices/nodes, stand alone computer systems, storage area networks, and the like. Computer system 600 of FIG. 6 is well adapted to having peripheral computer-readable storage media 602 such as, for example, a digital versatile disk (DVD), a compact disc, a flash memory, and the like coupled thereto.

System 600 of FIG. 6 includes an address/data bus 604 for communicating information, and a processor 606A coupled to bus 604 for processing information and instructions. As depicted in FIG. 6, system 600 is also well suited to a multi-processor environment in which a plurality of processors 606A, 606B, and 606C are present. Conversely, system 600 is also well suited to having a single processor such as, for example, processor 606A. Processors 606A, 606B, and 606C may be any of various types of microprocessors. System 600 also includes data storage features such as a computer usable volatile memory 608, e.g. random access memory (RAM), coupled to bus 604 for storing information and instructions for processors 606A, 606B, and 606C. System 600 also includes computer usable non-volatile memory 610, e.g. read only memory (ROM), coupled to bus 604 for storing static information and instructions for processors 606A, 606B, and 606C. Also present or communicatively coupled with system 600 is a data storage unit 612 (e.g., a magnetic or optical disk and disk drive, a solid state storage, a distributed storage cloud, a federated storage subsystem, and/or a storage area network, among others) coupled to bus 604 for storing information and instructions. System 600 also includes an optional alphanumeric input device 614 including alphanumeric and function keys coupled to bus 604 for communicating information and command selections to processor 606A or processors 606A, 606B, and 606C. System 600 also includes an optional cursor control device 616 coupled to bus 604 for communicating user input information and command selections to processor 606A or processors 606A, 606B, and 606C. In one embodiment, system 600 also includes an optional display device 618 coupled to bus 604 for displaying information.

Referring still to FIG. 6, optional display device 618 of FIG. 6 may be a liquid crystal device, cathode ray tube, plasma display device or other display device suitable for creating graphic images and alphanumeric characters recognizable to a user. Optional cursor control device 616 allows the computer user to dynamically signal the movement of a visible symbol (cursor) on a display screen of display device 618 and indicate user selections of selectable items displayed on display device 618. Many implementations of cursor control device 616 are known in the art including a trackball, mouse, touch pad, joystick or special keys on alphanumeric input device 614 capable of signaling movement of a given direction or manner of displacement. Alternatively, it will be appreciated that a cursor can be directed and/or activated via input from alphanumeric input device 614 using special keys and key sequence commands. System 600 is also well suited to having a cursor directed by other means such as, for example, voice commands. System 600 also includes an I/O device 620 for coupling system 600 with external entities. For example, in one embodiment, I/O device 620 is a modem for enabling wired or wireless communications between system 600 and an external network such as, but not limited to, the Internet. It is appreciated however, that in some embodiments, one or more of a display device 618, alphanumeric input device 614, and cursor control device 616 may not be included and instead, system 600 may be interacted with and administered from a remote location.

Referring still to FIG. 6, various other components are depicted for system 600. Specifically, when present, an operating system 622, applications 624, modules 626, and data 628 are shown as typically residing in one or some combination of computer usable volatile memory 608 (e.g., RAM), computer usable non-volatile memory 610 (e.g., ROM), and data storage unit 612. In some embodiments, all or portions of various embodiments described herein are stored, for example, as an application 624 and/or module 626 in memory locations within RAM 608, computer-readable storage media within data storage unit 612, peripheral computer-readable storage media 602, and/or other tangible computer readable storage media. In one embodiment, system 100 and/or deduplication engine 200 are implemented in or with computer system 600.

Example embodiments of the subject matter are thus described. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A computer-implemented method of linking to information in a deduplication data sequence, said method comprising:
   identifying a branching point where a branch data sequence diverges from a parent data sequence that has been previously stored in a data deduplication process;
   determining a signature value associated with a subsequence of information represented in said branch data sequence;
   identifying a branch location where said information of said branch data sequence begins; and
   in association with said branching point, storing link information in a computer memory, wherein said link information comprises a link to said branch location and also comprises a portion of said signature value.

2. The computer-implemented method as recited in claim 1, further comprising:
   during a follow-on deduplication activity involving reference to said branching point of said parent data sequence, comparing a second signature value associated with a next blocklet to be deduplicated in said follow-on deduplication activity to determine if said portion of said signature value matches with a like range of said second signature value; and
   in the event of said portion matching, using said link information to branch to said branch location to continue with said follow-on deduplication activity.

3. The computer-implemented as recited in claim 1, further comprising:
   identifying a returning point where said branch data sequence returns to said parent data sequence;
   identifying a return location in said parent data sequence where said branch data sequence returns from said returning point to resume said parent data sequence;
   determining a return location signature value of a blocklet of information represented at said return location; and
   in association with said returning point, storing additional link information in said computer memory, wherein said additional link information comprises a link to said return location and also comprises a portion of said return location signature value.

4. The computer-implemented method as recited in claim 1, wherein said identifying a branching point where a branch data sequence diverges from a parent data sequence that has been previously stored in a data deduplication process comprises:
   identifying an end point associated with the end of a cluster of stored deduplication information.

5. The method as recited in claim 1, wherein said determining a signature value associated with a subsequence of information represented in said branch data sequence comprises:
   determining said signature value for a head of said branch data sequence.

6. The method as recited in claim 1, wherein said determining a signature value associated with a subsequence of information represented in said branch data sequence comprises:
   determining said signature value for a tail of said branch data sequence.

7. The computer-implemented as recited in claim 1, wherein said storing link information in a computer memory comprises:
   storing said link information in a cluster header of plurality of deduplication clusters that include said branching point.

8. The computer-implemented as recited in claim 1, wherein said storing said link information in said computer memory comprises:
   storing a pointer in a cluster header for a plurality of deduplication clusters.

9. The computer-implemented as recited in claim 1, wherein said storing said link information in said computer memory comprises:
   storing a pointer to a memory address that includes a head subsequence or a tail subsequence of said branch data sequence.

10. The computer-implemented method as recited in claim 1, wherein said storing link information in a computer memory, wherein said link information comprises a link to said branch location and a portion of said signature value comprises:
    storing an entirety of said signature value as said portion of said signature value.

11. The computer-implemented method as recited in claim 1, wherein said storing link information in a computer memory, wherein said link information comprises a link to said branch location and a portion of said signature value comprises:
    storing a subset of said signature value as said portion of said signature value.

12. A computer-implemented method of informed deduplication link information management, said method comprising:
    in association with a diverging point from a data sequence, storing link information in a computer memory, wherein said link information comprises a link to a divergent location where information of a divergent data sequence begins diverging from said diverging point;
    storing an updatable link value in association with said link information, wherein said link value is set to an initial level upon initial storage of said link information and updated over time as a function of whether the link information is successfully employed to link to a branch data sequence; and
    using said link value to inform competitively managed retention of a plurality of link information stored in said computer memory.

13. The computer-implemented method as recited in claim 12, wherein said storing an updatable link value in association with said link information comprises:
   storing said link value in a cluster header for a plurality of clusters of deduplication information, wherein said diverging point is included in one of said clusters.

14. The computer-implemented method as recited in claim 12, wherein said storing an updatable link value in association with said link information, wherein said link value is set to an initial level upon initial storage of said link information and updated over time as a function of whether the link information is successfully employed to link to a branch data sequence comprises:
   incrementing said link value for each successful use of said link information; and
   decrementing said link value as said link information ages with non-use.

15. The computer-implemented method as recited in claim 12, wherein said using said link value to inform competitively managed retention of a plurality of link information stored in said computer memory comprises:
   determining a lowest valued link information from a plurality of stored link information; and
   displacing said lowest valued link information to make room for new link information.

16. The computer-implemented method as recited in claim 15, wherein said displacing said low-valued link information to make room for new link information comprises:
   displacing said lowest valued link information from a cluster header.

17. The computer-implemented method as recited in claim 15, wherein said displacing said low-valued link information to make room for new link information comprises:
   deleting said lowest valued link information.

18. The computer-implemented method as recited in claim 15, wherein said displacing said low-valued link information to make room for new link information comprises:
   moving said lowest valued link information to a secondary storage location.

19. A non-transitory computer-readable storage medium having instructions stored thereon for causing a computer processor to perform a method of linking to deduplication information, said method comprising instructions for:
   identifying a branching point where a branch data sequence diverges from a parent data sequence that has been previously stored in a data deduplication process;
   determining a signature value associated with a subsequence of information represented in said branch data sequence;
   identifying a branch location where said information of said branch data sequence begins;
   storing link information in a computer memory, wherein said link information comprises a link to said branch location and also comprises a portion of said signature value; and
   storing an updatable link value in said computer memory, said link value providing a usefulness ranking for said link information.

20. The non-transitory computer-readable storage medium of claim 19, wherein said method further comprises instructions for:
   using said link value to inform competitively managed retention of a plurality of link information stored in said computer memory.

21. The non-transitory computer-readable storage medium of claim 19, wherein said storing an updatable link value in said computer memory, said link value providing a usefulness ranking for said link information further comprises instructions for:
   updating said link value over time based upon usefulness of said link information.

22. The non-transitory computer-readable storage medium of claim 19, wherein said determining a signature value associated with a subsequence of information represented in said branch data sequence comprises:
   determining said signature value associated with a head subsequence of said information represented in said branch data sequence.

23. A deduplication link creation and management system, said system comprising:
   a computer system;
   a computer memory of said computer system;
   a branching point identifier portion of said computer system, said branching point identifier configured for identifying a branching point where a branch data sequence diverges from a parent data sequence that has been previously stored in a data deduplication process;
   a signature value determiner portion of said computer system, said signature value determiner portion configured for determining a signature value associated with a subsequence of information represented in said branch data sequence;
   a branch location identifier portion of said computer system, said branch location identifier configured for identifying a branch location where said information of said branch data sequence begins;
   a link information storer portion of said computer system, said link information storer configured for storing link information in said computer memory, wherein said link information comprises a link to said branch location and also comprises a portion of said signature value; and
   a link value storer portion of said computer system, said link value storer configured for storing an updatable link value in said computer memory, said link value providing a usefulness ranking for said link information.

24. The system of claim 23, further comprising:
   a link information manager portion of said computer system, said link information manager configured for using said link value to inform competitively managed retention of a plurality of link information stored in said computer memory.

25. The system of claim 23, further comprising:
   a link value updater portion of said computer system, said link value updater configured for updating said link value over time based upon usefulness of said link information.

* * * * *

UNITED STATES PATENT AND TRADEMARK OFFICE
CERTIFICATE OF CORRECTION

PATENT NO. : 8,442,954 B2
APPLICATION NO. : 12/506400
DATED : May 14, 2013
INVENTOR(S) : Spackman et al.

It is certified that error appears in the above-identified patent and that said Letters Patent is hereby corrected as shown below:

Detailed Description of Invention:

In column 6, line 19, delete "be perform by" and insert --be performed by--.

In column 11, line 1, delete "such as storage area network" and insert --such as a storage area network--.

In column 11, lines 51-52, delete "For purposes of example, and not limitation.".

In column 12, line 3, delete "is associated still associated" and insert --is still associated--.

In column 13, line 37, delete "embodiment the only" and insert --embodiment only--.

In column 16, line 59, delete "method storing an" and insert --method stores an--.

In column 17, line 8, delete "may be numerical" and insert --may be a numerical--.

Claims:

In column 21, line 52, delete "computer-implemented as recited" and insert --computer-implemented method as recited--.

In column 22, line 19, delete "computer-implemented as recited" and insert --computer-implemented method as recited--.

In column 22, line 25, delete "computer-implemented as recited" and insert --computer-implemented method as recited--.

Signed and Sealed this
Twentieth Day of August, 2013

Teresa Stanek Rea
*Acting Director of the United States Patent and Trademark Office*

CERTIFICATE OF CORRECTION (continued)
U.S. Pat. No. 8,442,954 B2

In column 22, line 31, delete "computer-implemented as recited" and insert --computer-implemented method as recited--.